(12) United States Patent
Gomes et al.

(10) Patent No.: US 12,504,475 B2
(45) Date of Patent: Dec. 23, 2025

(54) FAIL OPEN DETECTION

(71) Applicant: Hamilton Sundstrand Corporation, Charlotte, NC (US)

(72) Inventors: Alex Gomes, Chicago, IL (US); Joshua C. Swenson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 185 days.

(21) Appl. No.: 18/219,908

(22) Filed: Jul. 10, 2023

(65) Prior Publication Data

US 2025/0020721 A1 Jan. 16, 2025

(51) Int. Cl.
*G01R 31/327* (2006.01)

(52) U.S. Cl.
CPC ................... *G01R 31/3277* (2013.01)

(58) Field of Classification Search
CPC ............... G01R 31/327–3278; H02H 1/0007
See application file for complete search history.

(56) References Cited

U.S. PATENT DOCUMENTS

| | | | | |
|---|---|---|---|---|
| 4,434,358 | A | * | 2/1984 | Apfelbeck ............... H05B 3/84 327/332 |
| 4,932,246 | A | * | 6/1990 | Deutsch ............. G01R 31/2829 73/114.45 |
| 8,836,338 | B2 | | 9/2014 | Tyler et al. |
| 10,955,477 | B2 | | 3/2021 | Robertson |
| 11,137,449 | B1 | | 10/2021 | De Cicco et al. |
| 2013/0154717 | A1 | * | 6/2013 | Tyler ...................... H03K 17/12 327/419 |
| 2023/0052283 | A1 | * | 2/2023 | Takano ................... H03K 5/24 |
| 2023/0178976 | A1 | * | 6/2023 | Nakagawa ......... G01R 31/3278 361/106 |

FOREIGN PATENT DOCUMENTS

| | | | |
|---|---|---|---|
| CA | 2762475 A1 | 6/2012 | |
| EP | 2843837 A1 | 3/2015 | |
| JP | 6627633 B2 | 1/2020 | |
| KR | 20230065718 A | * 5/2023 | ............. G01R 1/203 |

OTHER PUBLICATIONS

Translation of KR 20230065718A. May 12, 2023. (Year: 2023).*
European Search Report dated Dec. 2, 2024 in connection with European Patent Application No. 24182557.9, 8 pages.

* cited by examiner

*Primary Examiner* — Thienvu V Tran
*Assistant Examiner* — Christopher J Clark

(57) ABSTRACT

A system includes a solid state power controller (SSPC) including a plurality of switching devices connected in parallel. A gate driver is operatively connected to control the plurality switching devices together so all of the switching devices in the plurality of switching devices either close to pass current through the SSPC, or open to prevent current passing through the SSPC in a normal operation mode. A fail open test circuit is operatively connected to individually control a respective gate of each of the switching devices in the plurality of switching devices for testing the plurality of switching devices individually for a fail OPEN condition.

20 Claims, 2 Drawing Sheets

FAIL OPEN DETECTION

BACKGROUND

1. Field

The present disclosure relates to switching devices such as used in power converters, and more particularly to failure detection in solid state switching devices such as MOSFETS.

2. Description of Related Art

Typical solid state power controller (SSPC) designs use a combination of multiple parallel solid state switches to achieve high current capabilities, where the current is shared across the multiple solid state switches. The multiple solid state switches are typically monitored for failed CLOSED conditions, by removing control power and monitoring presence/absence of voltage on the SSPC output. However, if any of these solid state switches fail OPEN, the traditional architectures cannot detect the condition. A failed OPEN switch becomes a latent-for-life-failure with consequences on power quality for the end user, e.g. higher SSPC impedance, and overheating SSPCs, since there must be more current flowing through the remaining solid state switches, with potential consequences on system operation and safety.

The conventional techniques have been considered satisfactory for their intended purpose. However, there is an ever present need for improved systems and methods for detecting failures in switching devices. This disclosure provides a solution for this need.

SUMMARY

A system includes a solid state power controller (SSPC) including a plurality of switching devices connected in parallel. Each switching device in the plurality of switching devices includes an input connected to an input node of the SSPC and an output connected to an output node of the SSPC so that the plurality of switching devices can divide current passing through the SSPC from the input node to the output node. A gate driver is operatively connected to control the plurality switching devices together so all of the switching devices in the plurality of switching devices either close to pass current through the SSPC, or open to prevent current passing through the SSPC in a normal operation mode. A fail open test circuit is operatively connected to individually control a respective gate of each of the switching devices in the plurality of switching devices for testing the plurality of switching devices individually for a fail OPEN condition.

An SSPC controller can be operatively connected to the gate driver and to the fail open test circuit, wherein the SSPC controller is configured to perform a power on built in test (PBIT) and to perform normal operation mode after completion of the PBIT. The PBIT can include setting a bias for one switching device in a plurality of switching devices of a solid state power controller (SSPC) to a low value to pass a test current through the one switching device, receiving feedback indicative of output voltage of the SSPC, evaluating if the feedback indicative of output voltage of the SSPC matches an expected value, and if so determining the one switching device passes for fail OPEN testing, and evaluating if the feedback indicative of output voltage of the SSPC does not match the expected value, and if so determining the one switching device fails for fail OPEN testing. The PBIT can include repeating the setting a bias, receiving feedback indicative of output voltage, and determining for each switching device in the plurality of switching devices, and outputting a maintenance message if any of the switching devices of the plurality of switching devices fail testing for fail OPEN.

A voltage sensor can be operatively connected to generate feedback indicative of voltage of the output node, and can be operatively connected to communicate the feedback to the fail open test circuit for use in the PBIT. The gate driver, the fail open test circuit, and the SSPC controller can all be included in a single controller. The plurality of switching devices can be MOSFETs or IGBTs.

A method includes setting a bias for one switching device in a plurality of switching devices of a solid state power controller (SSPC) to a low value to pass a test current through the one switching device. The method includes receiving feedback indicative of output voltage of the SSPC, evaluating if the feedback indicative of output voltage of the SSPC matches an expected value, and if so determining the one switching device passes for fail OPEN testing, and evaluating if the feedback indicative of output voltage of the SSPC does not match the expected value, and if so determining the one switching device fails for fail OPEN testing. The method includes repeating the setting a bias, receiving feedback indicative of output voltage, and determining for each switching device in the plurality of switching devices; and outputting a maintenance message if any of the switching devices of the plurality of switching devices fail testing for fail OPEN.

The method can include testing the switching devices for fail CLOSED by commanding all of the plurality of switching devices open and testing voltage at the output node. There can be a fail CLOSED if there is non-zero voltage at the output node while the switching devices are commended open. The method can include outputting a maintenance message if there is a fail CLOSED. If none of the switching devices of the plurality of switching devices fails testing for fail OPEN, the method can include ending a power on built in test (PBIT) mode and initiating a normal operation mode which includes controlling the plurality switching devices together so all of the switching devices in the plurality of switching devices either close to pass current through the SSPC or open to prevent current passing through the SSPC.

The method can include in response to the maintenance message, replacing or repairing the SSPC. Passing the test current through the one switching device can be done such that any voltage at the output node is low enough not to activate a load connected to be supplied by the output node. The one switching device can be biased in a linear mode.

A system includes a solid state power controller (SSPC) including a plurality of switching devices connected in parallel. Each switching device in the plurality of switching devices includes an input connected to an input node of the SSPC and an output connected to an output node of the SSPC so that the plurality of switching devices can divide current passing through the SSPC from the input node to the output node. A gate driver is operatively connected to control the plurality switching devices together so all of the switching devices in the plurality of switching devices either close to pass current through the SSPC, or open to prevent current passing through the SSPC in a normal operation mode, and to individually control a respective gate of each of the switching devices in the plurality of switching devices for testing the plurality of switching devices individually for a fail OPEN condition.

An SSPC controller can be operatively connected to the gate driver, wherein the SSPC controller is configured to perform a power on built in test (PBIT) and to perform normal operation mode after completion of the PBIT. A voltage sensor can be operatively connected to generate feedback indicative of voltage of the output node, and operatively connected to communicate the feedback to the gate driver for use in the PBIT. The gate driver and the SSPC controller can be included in a single controller.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
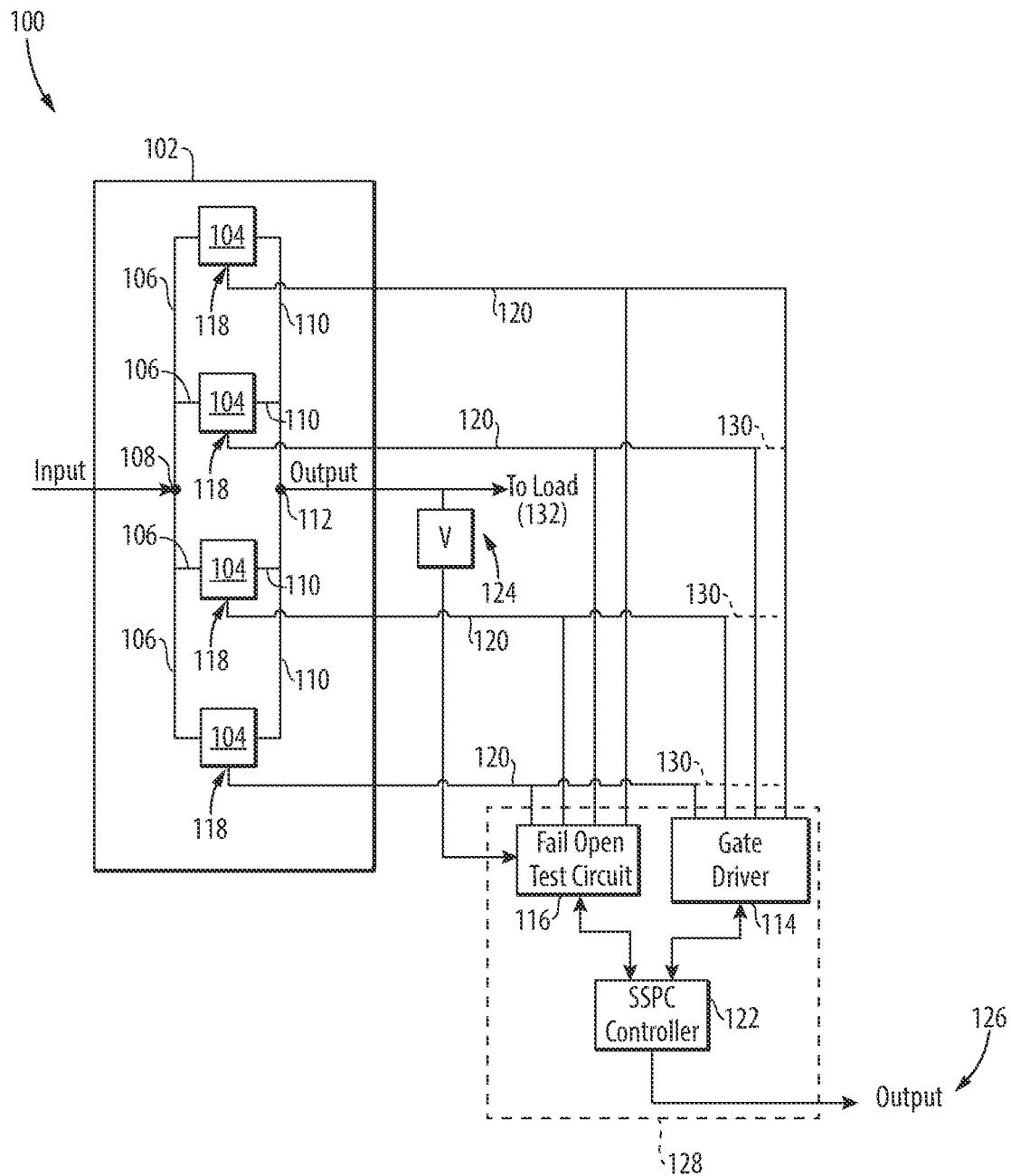
FIG. 1 is a schematic view of an embodiment of a system constructed in accordance with the present disclosure, showing the solid state power controller (SSPC) and fail open test circuit.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIG. 2, as will be described. The systems and methods described herein can be used to provide fail OPEN testing for solid state power controllers (SSPCs).

The system 100 includes a solid state power controller (SSPC) 102 including a plurality of switching devices 104 connected in parallel with one another. The system 100 also includes external interfaces, e.g. for the input and outputs labeled in FIG. 1. The SSPC 102 includes the switching devices 104 as well as the controllers 114, 116, 122 described below. FIG. 1 shows four switching devices 104, however those skilled in the art will readily appreciate that any suitable number of switching devices can be used without departing from the scope of this disclosure. Each switching device 104 includes an input 106 connected to an input node 108 of the SSPC 102 and an output 110 connected to an output node 112 of the SSPC 102 for the purposes of selectively coupling electrical power from the input node 108 to the output node 112. The switching devices 104 can divide with one another the current passing through the SSPC 102 from the input node 108 to the output node 112. The switching devices 104 can be MOSFETs, IGBTs, or any other suitable type of power switching devices.

A gate driver 114 is operatively connected to control the switching devices 104 all together so all of the switching devices 104 either close to pass current through the SSPC 102, or open to prevent current passing through the SSPC 102 in a normal operation mode. The connection of the gates 118 of the switching devices 104 to the gate driver 114 is through the respective lines 120. As indicated in FIG. 1 in broken lines, the switching devices 104 could instead connect to one common line 120 through branches 130 to the gate driver 114 as long as each branch 130 had a resistor connecting each branch 130 to the main line 120 so that each gate 118 could be controlled to a different voltage level. A fail open test circuit 116 is operatively connected, e.g. by respective lines 120, to individually control a respective gate 118 of each of the switching devices 104 for testing the switching devices 104 individually for a fail OPEN condition.

An SSPC controller 122 is operatively connected to the gate driver 114 and to the fail open test circuit 116. The SSPC controller 122 is configured to perform a power on built in test (PBIT) and to perform normal operation mode after completion of the PBIT.

The PBIT includes setting a bias for one switching device 104 at a time, e.g. starting with the top switching device 104 as oriented in FIG. 1, to a low value between open and closed, with the other switching devices 104 all set to open. This passes a test current through the one switching device 104, e.g. the top switching device 104 in FIG. 1. The PBIT includes receiving feedback indicative of output voltage of the SSPC 102 while the one switching device is set to a low bias value. Passing the test current through the one switching device 104 is done such that any voltage at the output node 112 is low enough not to activate a load 132 connected to the output node 112. For example, the bias can be set for a very low voltage output, so the load/user 132 downstream is not turned ON and the switching device 104 FET is not overloaded. The bias should be just enough to see a voltage at the output node 112 for a normal switching device 104. During the PBIT test, the one switching device 104 is biased in a linear mode, so the biasing is done to a known value with known expected results.

A voltage sensor 124 is operatively connected to generate feedback indicative of voltage of the output node 112, e.g. relative to a local ground, and is operatively connected to communicate the feedback to the fail open test circuit 116 for use in the PBIT. The sensor 124 voltage circuitry can have adequate accuracy and precision to read the output voltage. Those skilled in the art will appreciate that any other suitable type of feedback can be used such as electrical current, without departing from the scope of this disclosure.

The PBIT includes evaluating if the feedback matches an expected value, and if so determining the one switching device 104 passes the fail OPEN testing. The PBIT includes evaluating if the feedback does not match the expected value, and if so determining the one switching device 104 fails the fail OPEN testing. The PBIT includes repeating the sequence above for each switching device 104 one at a time, and outputting a maintenance message 126 if any of the switching devices 104 fail testing for fail OPEN. This maintenance message 126 can be output as a discrete output signal or as a parameter in a message on a communication bus, or by any other suitable means.

The gate driver 114, the fail open test circuit 116, and the SSPC controller 122 can all be separate devices interconnected as described above, or can all be included in a single controller 128, as individual hardware or functional components. In one configuration, a gate driver 114 can have the fail open test circuit built in, wherein the SSPC is operatively connected to control the plurality switching devices together in a normal operation mode so all of the switching devices 104 either close to pass current through the SSPC, or open to prevent current passing through the SSPC 102. This SSPC 114 also has dedicated lines 130 to individually control a respective gate 118 of each of the switching devices 104 for testing the plurality of switching devices individually for a fail OPEN condition. In this case, the voltage sensor 124 would connect to the gate driver 114 to provide feedback for the PBIT operation of the gate driver 114, and the SSPC controller 122 connects to interact with the PBIT function of the gate driver 114 as described above for the configuration using the fail open test circuit 116.

Figure 2:
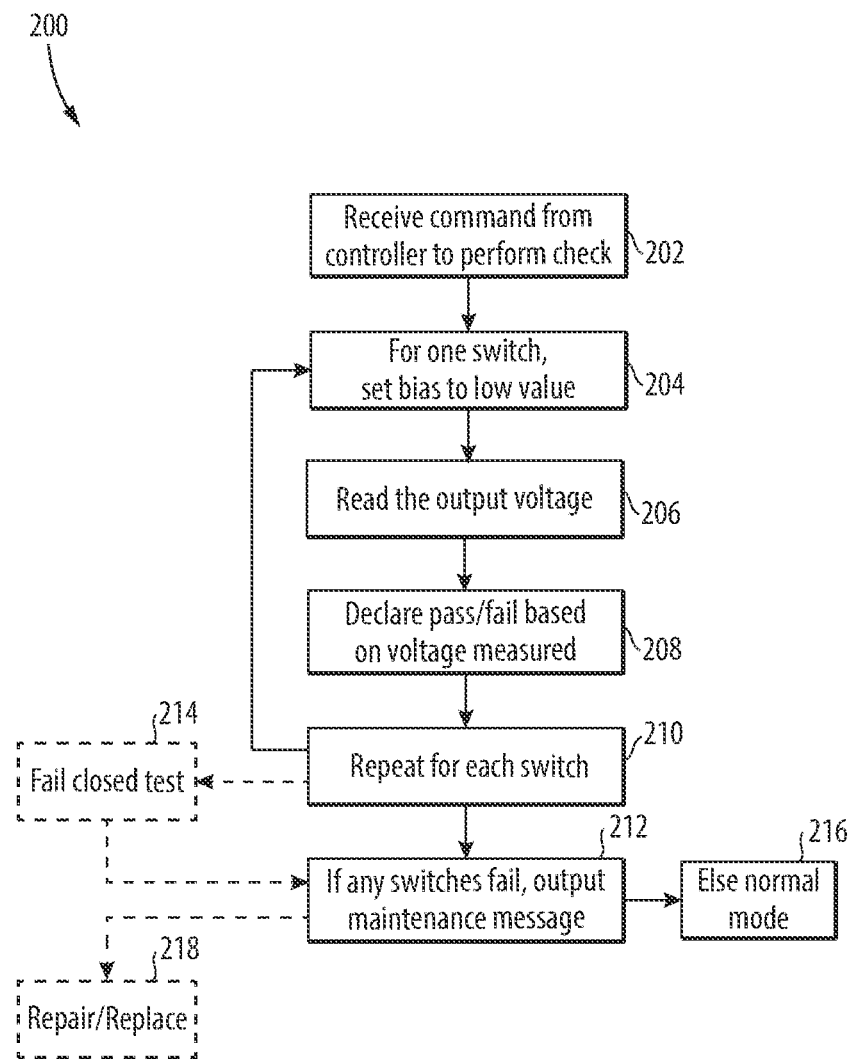
FIG. 2 is flow diagram of a method of operating the system of FIG. 1.

With reference now to FIG. 2, a method 200 includes receiving a command from a controller to perform a fail OPEN check, as indicated in box 202, and setting a bias for one switching device in a plurality of switching devices of a solid state power controller (SSPC) to a low value to pass a test current through the one switching device, as indicated in box 204. The method 200 includes receiving feedback indicative of output voltage of the SSPC, e.g. reading output voltage, as indicated in box 206. The method 200 includes evaluating if the feedback indicative of output voltage of the SSPC matches an expected value, and if so determining the one switching device passes for fail OPEN testing, as indicated in box 208. The method 200 also includes evaluating if the feedback indicative of output voltage of the SSPC does not match the expected value, and if so determining the one switching device fails for fail OPEN testing as indicated in box 208. The method 200 includes repeating the setting a bias, receiving feedback indicative of output voltage, and determining for each switching device in the plurality of switching devices, as indicated in box 210 and the arrow returning to box 204. As indicated by box 212, the method 200 includes outputting a maintenance message if any of the switching devices of the plurality of switching devices fail testing for fail OPEN.

The method can optionally include testing the switching devices for fail CLOSED by commanding all of the plurality of switching devices open and testing voltage at the output node, as indicated by box 214. There is a fail CLOSED if there is non-zero voltage at the output node while the switching devices are commended open. The method can include outputting a maintenance message there is a fail CLOSED, as indicated by box 212. If none of the switching devices of the plurality of switching devices fails testing for fail OPEN or optionally fails testing for fail CLOSED, the method can include ending a power on built in test (PBIT) mode and initiating a normal operation mode which includes controlling the plurality switching devices together so all of the switching devices in the plurality of switching devices either close to pass current through the SSPC or open to prevent current passing through the SSPC, as indicated by box 216. The method can include in response to the maintenance message, replacing or repairing the SSPC, as indicated in box 218, which can involve repairing or replacing the card, module, or the like, embodying the SSPC 102.

Systems and methods as disclosed herein provide various potential benefits including the following. They can prevent issues associated to loss of power quality and component overheating. They can provide better compliance with regulations, without only relying on reliability numbers, especially considering new architectures which will use a greater number of solid state relays/contactors or include them in more locations due to voltage levels.

The methods and systems of the present disclosure, as described above and shown in the drawings, provide for fail OPEN testing for SSPCs. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
 a solid state power controller (SSPC) including a plurality of switching devices connected in parallel, wherein each switching device in the plurality of switching devices includes an input connected to an input node of the SSPC and an output connected to an output node of the SSPC so that the switching devices are configured to divide current passing through the SSPC from the input node to the output node;
 a gate driver operatively connected to control the plurality of switching devices together so that all of the switching devices in the plurality of switching devices either close to pass current through the SSPC or open to prevent current passing through the SSPC in a normal operation mode; and
 a fail open test circuit operatively connected to individually control a respective gate of each of the switching devices in the plurality of switching devices for testing the plurality of switching devices individually for a fail OPEN condition;
 wherein the fail open test circuit is configured, for a specified switching device in the plurality of switching devices, to set a bias at the gate of the specified switching device to a low value between open and closed while all remaining switching devices in the plurality of switching devices are set to open, the fail open test circuit configured to bias the specified switching device in a linear mode.

2. The system as recited in claim 1, further comprising an SSPC controller operatively connected to the gate driver and to the fail open test circuit, wherein the SSPC controller is configured to perform a power on built in test (PBIT) and to enter the normal operation mode after completion of the PBIT.

3. The system as recited in claim 2, wherein the PBIT includes, for each one of the switching devices in the plurality of switching devices:
 setting the bias for the one switching device in the plurality of switching devices to the low value to pass a test current through the one switching device;
 receiving feedback indicative of an output voltage of the SSPC;
 evaluating if the feedback indicative of the output voltage of the SSPC matches an expected value and, if so, determining that the one switching device passes the testing for the fail OPEN condition; and
 evaluating if the feedback indicative of the output voltage of the SSPC does not match the expected value and, if so, determining that the one switching device fails the testing for the fail OPEN condition; and
 further comprising outputting a maintenance message if any switching device in the plurality of switching devices fails the testing for the fail OPEN condition.

4. The system as recited in claim 2, further comprising a voltage sensor operatively connected to generate feedback indicative of a voltage of the output node, the voltage sensor operatively connected to communicate the feedback to the fail open test circuit for use in the PBIT.

5. The system as recited in claim 2, wherein the gate driver, the fail open test circuit, and the SSPC controller are all included in a single controller.

6. The system as recited in claim 1, wherein the plurality of switching devices comprises MOSFETs.

7. The system as recited in claim 1, wherein the plurality of switching devices comprises IGBTs.

8. A method comprising:
setting a bias for one parallel-connected switching device in a plurality of parallel-connected switching devices of a solid state power controller (SSPC) to a low value between open and closed to pass a test current through the one switching device while all remaining switching devices in the plurality of switching devices are set to open, the low value of the bias biasing the one switching device in a linear mode; and
receiving feedback indicative of an output voltage of the SSPC.

9. The method as recited in claim 8, further comprising:
determining the one switching device passes a test for a fail OPEN condition if the feedback indicative of the output voltage of the SSPC matches an expected value;
determining the one switching device fails the test for the fail OPEN condition if the feedback indicative of the output voltage of the SSPC does not match the expected value;
repeating setting of the bias, receiving the feedback indicative of the output voltage, and determining passing or failing of the fail OPEN condition for each switching device in the plurality of switching devices;
outputting a maintenance message if any switching device in the plurality of switching devices fails the test for the fail OPEN condition;
testing the plurality of switching devices for a fail CLOSED condition by commanding all of the plurality of switching devices open and testing the output voltage of the SSPC, wherein the fail CLOSED condition is associated with a non-zero output voltage of the SSPC while the switching devices are commanded open; and
outputting a maintenance message if any switching device in the plurality of switching devices has the fail CLOSED condition.

10. The method as recited in claim 9, further comprising, if none of the switching devices in the plurality of switching devices fails the test for the fail OPEN condition:
ending a power on built in test (PBIT) mode; and
initiating a normal operation mode, which includes controlling the plurality of switching devices together so that all of the switching devices in the plurality of switching devices either close to pass current through the SSPC or open to prevent current passing through the SSPC.

11. The method as recited in claim 9, further comprising:
in response to either of the maintenance messages, replacing or repairing the SSPC.

12. The method as recited in claim 9, wherein passing the test current through the one switching device is done such that the output voltage of the SSPC is low enough not to activate a load connected to be supplied by the SSPC.

13. The method as recited in claim 12, wherein the one switching device is biased in the linear mode such that the bias has a known value intended to generate the expected value of the output voltage.

14. A system comprising:
a solid state power controller (SSPC) including a plurality of switching devices connected in parallel, wherein each switching device in the plurality of switching devices includes an input connected to an input node of the SSPC and an output connected to an output node of the SSPC so that the switching devices are configured to divide current passing through the SSPC from the input node to the output node; and
a gate driver operatively connected to control the plurality of switching devices together so that all of the switching devices in the plurality of switching devices either close to pass current through the SSPC or open to prevent current passing through the SSPC in a normal operation mode;
wherein the gate driver is configured to individually control a respective gate of each of the switching devices in the plurality of switching devices for testing the plurality of switching devices individually for a fail OPEN condition, wherein the gate driver is configured, for a specified switching device in the plurality of switching devices, to set a bias at the gate of the specified switching device to a low value between open and closed while all remaining switching devices in the plurality of switching devices are set to open, the gate driver configured to bias the specified switching device in a linear mode.

15. The system as recited in claim 14, further comprising an SSPC controller operatively connected to the gate driver, wherein the SSPC controller is configured to perform a power on built in test (PBIT) and to enter the normal operation mode after completion of the PBIT.

16. The system as recited in claim 15, wherein the PBIT includes, for each one of the switching devices in the plurality of switching devices:
setting the bias for the one switching device in the plurality of switching devices to the low value to pass a test current through the one switching device;
receiving feedback indicative of an output voltage of the SSPC;
evaluating if the feedback indicative of the output voltage of the SSPC matches an expected value and, if so, determining that the one switching device passes the testing for the fail OPEN condition; and
evaluating if the feedback indicative of the output voltage of the SSPC does not match the expected value and, if so, determining that the one switching device fails the testing for the fail OPEN condition; and
further comprising outputting a maintenance message if any switching device in the plurality of switching devices fails the testing for the fail OPEN condition.

17. The system as recited in claim 15, further comprising a voltage sensor operatively connected to generate feedback indicative of a voltage of the output node, the voltage sensor operatively connected to communicate the feedback to the gate driver for use in the PBIT.

18. The system as recited in claim 15, wherein the gate driver and the SSPC controller are included in a single controller.

19. The system as recited in claim 14, wherein the plurality of switching devices comprises MOSFETs.

20. The system as recited in claim 14, wherein the plurality of switching devices comprises IGBTs.

* * * * *